US012686924B2

(12) United States Patent
Xu et al.

(10) Patent No.: US 12,686,924 B2
(45) Date of Patent: Jul. 21, 2026

(54) HIGH-TEMPERATURE RESISTANT NANO-COPPER PRODUCED BY LASER DIRECT WRITING, PREPARATION METHOD AND APPLICATION THEREOF

(71) Applicant: Zhejiang University, Hangzhou (CN)

(72) Inventors: Kaichen Xu, Hangzhou (CN); Zimo Cai, Hangzhou (CN); Huayong Yang, Hangzhou (CN)

(73) Assignee: Zhejiang University, Hangzhou (CN)

( * ) Notice: Subject to any disclaimer, the term of this patent is extended or adjusted under 35 U.S.C. 154(b) by 0 days.

(21) Appl. No.: 19/096,567

(22) Filed: Mar. 31, 2025

(65) Prior Publication Data

US 2025/0354267 A1 Nov. 20, 2025

(30) Foreign Application Priority Data

May 17, 2024 (CN) ......................... 202410615775.3

(51) Int. Cl.
| | |
|---|---|
| *B05D 3/06* | (2006.01) |
| *C23C 18/16* | (2006.01) |
| *C23C 18/40* | (2006.01) |
| *H01C 7/00* | (2006.01) |
| *H10N 97/00* | (2023.01) |

(52) U.S. Cl.
CPC ............ *C23C 18/1612* (2013.01); *B05D 3/06* (2013.01); *C23C 18/1667* (2013.01); *C23C 18/40* (2013.01); *H01C 7/008* (2013.01); *H10N 97/00* (2023.02); *C23C 18/1676* (2013.01)

(58) Field of Classification Search
None
See application file for complete search history.

(56) References Cited

FOREIGN PATENT DOCUMENTS

| | | |
|---|---|---|
| CN | 102675960 A | 9/2012 |
| CN | 105562701 A | 5/2016 |
| CN | 107267938 A | 10/2017 |
| CN | 107470609 A * | 12/2017 ............... H01B 1/02 |
| CN | 107470609 B | 5/2019 |
| CN | 109954876 A | 7/2019 |
| CN | 113764120 A | 12/2021 |
| CN | 114150317 A | 3/2022 |
| CN | 113981410 B | 12/2023 |

OTHER PUBLICATIONS

Li et al. "Mixed ink of copper nanoparticles and copper formate complex with low sintering temperatures". J Mater Sci: Mater Electron (2016) 27:11432-11438. DOI 10.1007/s10854-016-5269-8 (Year: 2016).*

Rahman et al. "Green laser sintering of copper oxide (CuO) nano particle (NP) film to form Cu conductive lines". AIP Advances 8, 095008 (2018) (Year: 2018).*

Xu et al. "An in-situ hybrid laser-induced integrated sensor system with antioxidative copper", Int. J. Extrem. Manuf. 6 (2024) 065501 (12pp). doi.org/10.1088/2631-7990/ad6aae (Year: 2024).*

Research Progress on Copper Microelectrodes Materials for Laser Direct Writing, Cheng Jian et al., "Surface Technology", vol. 52, issue 8, Aug. 2023.

* cited by examiner

*Primary Examiner* — Jose I Hernandez-Kenney
(74) *Attorney, Agent, or Firm* — Hawaii Patent Services; Nathaniel K. Fedde; Kenton N. Fedde

(57) ABSTRACT

The present disclosure provides a high-temperature resistant nano-copper produced by laser direct writing, a preparation method and an application thereof. The high-temperature resistant nano-copper exhibits excellent oxidation resistance, thermal stability and superior conductivity. In this disclosure, the preparation is simple, and the nano-copper oxide ink can be stored for extended periods without being affected by oxidation. It is suitable for various manufacturing processes including printing, coating, and other similar methods. Moreover, based on laser direct writing, the processing efficiency is high, enabling the one-step integration of multi-performance of the high-temperature resistant nano-copper. The high-temperature resistant nano-copper described in the present disclosure can be used as an interconnection circuit in an integrated sensor system based on all-laser in-situ direct writing, and can be widely applied in fields of aerospace, automobile, electronics, etc.

6 Claims, 9 Drawing Sheets

1

HIGH-TEMPERATURE RESISTANT NANO-COPPER PRODUCED BY LASER DIRECT WRITING, PREPARATION METHOD AND APPLICATION THEREOF

CROSS-REFERENCE TO RELATED APPLICATION

This application claims priority of Chinese Patent Application No. 202410615775.3, filed on May 17, 2024, the entire contents of which are incorporated herein by reference.

TECHNICAL FIELD

The present disclosure relates to the field of nano-copper preparation, and in particular to a high-temperature resistant nano-copper produced by laser direct writing, a preparation method and an application thereof.

BACKGROUND

As a widely used metal in human society, copper plays an important role in architecture, electrical, communication, energy, medical and other fields with its unique properties and advantages. Nano-copper has become a promising material in functional electronics fields including conductive electrodes, transistors, sensors and electrochemical cells due to its excellent electrical/thermal properties and cost-effectiveness. However, copper is easily oxidized at high temperatures, resulting in deterioration of metal properties and degradation of conductivity, which greatly limits its application. Compared with bulk copper, nano-copper holds a high specific surface area and reacts more easily with oxygen. Therefore, the oxidation failure problem of nano-copper is much more serious than that of bulk copper.

To improve the high-temperature oxidation resistance and thermal stability of nano-copper, a variety of anti-oxidation treatment methods have been developed.

(1) Surface coating: by plating a layer of inert materials (such as graphene, graphene oxide, gold, silver, platinum and other precious metals) on the surface of nano-copper, the direct contact between oxygen and nano-copper can be effectively blocked.

(2) Surface modification: the surface adsorption or chemical bonding of certain organic molecules/polymers can react with nano-copper to form stable compounds, thereby slowing down its oxidation rate at high temperatures.

(3) Alloying: nano-copper is compounded with other metals (such as nickel, tin, aluminum, manganese, etc.) to form an alloy to increase the melting point of nano-copper, thus improving its oxidation resistance at high temperatures.

(4) Atmosphere control: during the sintering or high-temperature treatment of nano-copper, oxidation can be effectively prevented by controlling the treatment atmosphere (such as using inert/reducing gas protection or vacuum conditions).

Among the above treatment methods, the high-temperature oxidation resistance effects of methods (1) and (2) are more remarkable. However, these methods cause higher costs, more cumbersome processes, and affect the electro-thermal properties of nano-copper to some extent. Although the method (3) can improve the oxidation resistance, it also alters other physical and chemical properties of nano-copper, making it no longer suitable for its original application requirements. The method (4) is mainly suitable for specific processing environments and difficult to maintain for a long time in practical applications, and requires expensive equipment, which increases operational complexity and cost.

In the related art, corresponding to the method (1), taking PREPARATION METHOD FOR OXIDATION-RESISTANT COPPER-BASED SURFACE-ENHANCED RAMAN SCATTERING SUBSTRATE with a patent number of CN202111501706.2 as an example, this method involves preparing a nanoporous copper strip with a bicontinuous structure through melt-spinning and dealloying methods. The nanoporous copper is then acid-washed to remove the surface oxide layer. Finally, a graphene oxide solution is spin-coated onto the surface of nanoporous copper, which is immediately transferred to a tube furnace for thermal reduction under a hydrogen and argon atmosphere to obtain nanoporous copper coated with an ultra-thin reduced graphene oxide layer. This further slows down the oxidation, ensuring the stability of the reduced graphene oxide/nanoporous copper composite substrate in Raman detection. Although this method offers good stability and high repeatability, the process steps are complicated, require an inert gas environment, and involve relatively harsh reaction conditions.

In the related art, corresponding to the method (1), taking OXIDATION-RESISTANT NANO-COPPER SOLDER PASTE AND PREPARATION METHOD AND APPLICATION THEREFOR with a patent number of CN201710343566.8 as an example, this method involves uniformly coating the surface of nano-copper powders with a metal film (gold or silver) using a magnetron sputtering process. The traditional nano-copper solder paste formula is retained, and an appropriate amount of molding auxiliary agent is added to finally prepare a novel oxidation-resistant nano-copper solder paste with resistance to oxidation and cracking. Although this method avoids the oxidation of nano-copper by encapsulating it with an inert metal layer (gold/silver), allowing it to function at high temperatures for extended periods without failure, it significantly increases material costs and limits large-scale application.

In the related art, corresponding to the method (2), taking PREPARATION METHOD FOR OXIDATION-RESISTANT COPPER NANOWIRE with a patent number of CN201710752263.1 as an example, firstly, copper nanowires are added into a dispersant, followed by the addition of a polar organic solvent and/or water to obtain a copper-nanowire dispersion. An oxidation-resistant agent is then added into the copper-nanowire dispersion for mixing to obtain a mixed liquid. The mixed liquid is placed in a pressurized and heated sealing system for reaction. Finally, after cooling, the liquid undergoes liquid-solid separation and washing to obtain oxidation-resistant surface-treated copper nanowires. Although this method is simple and low-cost, the operation process is cumbersome, requires a long reaction time, and needs pressurized and heated closed reaction conditions, making it unsuitable for efficient treatment at room temperature.

In the related art, corresponding to the method (2), taking OXIDATION-RESISTANT COPPER FILM/COPPER WIRE AND PREPARATION METHOD AND APPLICATION THEREFOR with a patent number of CN202110912124.7 as an example, this method involves grinding and mixing oxidation-resistant copper powders, an alcohol solvent, an alcohol amine solvent, a resin and an auxiliary agent, followed by defoaming to obtain an oxidation-resistant copper slurry. The slurry is coated on a substrate, dried and pre-cured in an inert atmosphere to obtain a copper film precursor 1/copper wire precursor 1. This precursor is then cured in the inert atmosphere to obtain a copper film precursor 2/copper wire precursor 2, which is treated with a compound containing sulfhydryl or disulfide bonds to produce the oxidation-resistant copper film/copper wires. In this present disclosure, although the resulting copper film/wires exhibit excellent oxidation-resistance, the process requires an inert atmosphere to achieve high conductivity, and the preparation conditions are relatively harsh.

In the related art, corresponding to method (3), taking PREPARATION METHOD FOR COPPER-NICKEL ALLOY NANOPARTICLES with a patent number of CN201410532942.4 as an example, a mixed solution of copper nitrate trihydrate and nickel nitrate hexahydrate is prepared, followed by stirring and adding a complexing agent and dispersant (the molar ratio of copper nitrate to the complexing agent is 1:0.5-1:4, and the molar ratio of copper nitrate to the dispersant is 1:1-1:2). The above solution is then placed in a drying oven at 160-180° C. and dried to a porous xerogel without moisture. In an argon atmosphere, the xerogel is calcined at 500-700° C. for 2-5 h to obtain copper-nickel alloy nanoparticles. In this present disclosure, although the raw materials are easily available and high-yield, the preparation process involves high temperatures and an inert atmosphere, which limits its wide application to a certain extent.

In the related art, corresponding to the method (3), taking NANO-COPPER-TIN ALLOY CONDUCTIVE INK AND PREPARATION METHOD AND USE METHOD THERE-FOR with a patent number of CN201110055004.6 as an example, nano-copper-tin alloy is adopted instead of nano-copper-silver alloy as a conductive filler in conductive ink. This not only reduces the sintering temperature of the conductive ink, but also improves the oxidation resistance during sintering, as well as the mechanical properties and weldability of the conductive circuit formed after sintering compared to the nano copper-silver alloy conductive ink. Additionally, it avoids the problem of silver ion migration. Furthermore, the nano-copper-tin alloy is doped with rare earth metal elements, which increases its grain boundaries, electron scattering rate and conductivity compared to the nano-copper alloy. On the other hand, the raw material cost of the conductive ink is also reduced. However, the addition of tin element lowers the melting point of nano-copper-tin alloy, which is not conducive to the oxidation resistance in long-term high temperature environment.

In the related art, corresponding to the method (4), taking PREPARATION METHOD FOR OXIDATION-RESISTANT MICRO-NANO-COPPER MATERIAL with a patent number of CN201910399914.2 as an example, micro-nano-copper powders are prepared using a micro-nano-copper preparation device. An organic coating agent is placed in a vacuum chamber of an in-situ coating device, and is sublimated or vaporized by heating. Inert gas is introduced into the preparation system, and the micro-nano-copper powders are introduced into the vacuum chamber of the in-situ coating device by the inert gas. The sublimated or vaporized organic coating agent then contacts and coats the surface of the micro-nano-copper particles. In this present disclosure, although a good organic coating is formed on the surface of micro-nano-copper ions through vacuum heating and inert atmosphere, significantly improving the oxidation resistance and dispersibility while reducing the surface activity, the specific treatment environment throughout the process is bound to greatly increase the cost, which mismatches the practical applications.

In the related art, corresponding to the method (4), taking OXIDATION-RESISTANT SUPER-HYDROPHOBIC COPPER THIN FILM AND PREPARATION METHOD THEREFOR with a patent number of CN202111250495.X as an example, this method uses copper nanoclusters generated from the decomposition of organometallic precursors as catalysts to decompose liquid organic precursors into graphite carbon. The graphite carbon is enriched on the surface of the copper nanoclusters to form crystalline grains with a copper-carbon core-shell structure. Countless copper-carbon grains are then piled up on the surface of a substrate to form an oxidation-resistant super-hydrophobic copper thin film. In this present disclosure, the oxidation-resistant copper-carbon thin film is mainly formed on the surface of the substrate by chemical vapor deposition method, the rough nanostructure surface formed by deposition is used to obtain super-hydrophobic characteristics, the overall control is convenient and the repeatability is good, but the harsh reaction conditions (requiring a hydrogen and argon inert atmosphere, a reaction temperature is 400-600° C. and a reaction pressure is 1000-9000 Pa) cannot be avoided, which inevitably leads to cost-effectiveness issues.

Therefore, developing an oxidation-resistant surface treatment method with simple preparation, efficient processing, high compatibility and excellent cost-effectiveness for high-temperature resistant nano-copper is currently a technical challenge to address the application of nano-copper in functional electronics fields including conductive electrodes, transistors, sensors and electrochemical cells.

SUMMARY

In response to the deficiencies of the related art, an objective of the present disclosure is to provide a high-temperature resistant nano-copper produced by laser direct writing, a preparation method and an application thereof. The high-temperature resistant nano-copper is induced by laser direct writing.

A preparation method for the high-temperature resistant nano-copper produced by laser direct writing mainly includes the following steps:

(1) uniformly heating and stirring an alcohol solvent, an organic dispersant, an organic auxiliary agent and an appropriate amount of formate to obtain a precursor solution;

(2) adding an appropriate amount of nano-copper oxide into the precursor solution and thoroughly dispersing the mixture via ultrasonication to obtain a nano-copper oxide ink;

(3) coating a pretreated substrate with the nano-copper oxide ink, followed by heating and drying to obtain a nano-copper oxide film;

(4) applying laser direct writing-induced passivation/photothermal reduction sintering to the nano-copper oxide film to obtain a high-temperature resistant nano-copper.

The alcohol solvent in step (1) is selected from at least one of monohydric alcohols, dihydric alcohols, and polyhydric alcohols. The organic dispersant is selected from at least one of polyacrylamide-based organic polymers, polyethylene oxide-based organic polymers, tannin, and lignin, but is not limited thereto. The organic auxiliary agent is an organic amide, selected from at least one of alkyl amides with a chemical formula conforming to $C_nH_{2n+1}NO$ ($1 \leq n \leq 5$). The formate is selected from at least one of lithium formate, beryllium formate, sodium formate, magnesium formate, potassium formate, calcium formate, iron formate, manganese formate, cobalt formate, nickel formate, copper formate, zinc formate, barium formate and ammonium formate. A temperature of heating and stirring is 50-70° C., a rotation speed is 600-1500 rpm, and a duration is 2-20 h.

The nano-copper oxide in step (2) is selected from at least one of copper oxide nanoparticles, copper oxide nanowires, copper oxide nanosheets, copper oxide nanorods, and copper oxide nanoshutles. A real-time temperature during ultrasonic dispersion is 50-60° C., an ultrasonic pulse width is 0.1 s, and an ultrasonic duration is 0.1-2 h. In addition, the ultrasonic dispersion can be realized by adding a small amount of nano-copper oxide multiple times to prevent severe agglomeration and poor dispersion of the copper oxide nanowires, which would hinder subsequent laser-induced direct writing. The nano-copper oxide ink includes 43.0-50.4 wt % of nano-copper oxide, 37.1-50.4 wt % of alcohol solvent, 3.4-5.3 wt % of organic dispersant, 0.0-9.5 wt % of organic auxiliary agent and 1.3-2.0 wt % of formate. The nano-copper oxide ink can be stored for a long time without being affected by oxidation, and is suitable for various manufacturing processes, including printing, coating, and other methods.

The coating method described in step (3) is selected from at least one of spin coating, spray coating, knife coating, brush coating, drop coating, and screen printing, but is not limited thereto. The pretreatment involves oxygen plasma surface treatment with a treatment duration of 60-150 s. The substrate includes flexible and rigid substrates. The flexible substrate is selected from at least one of polyimide (PI), polyethylene terephthalate (PET), polyvinyl alcohol (PVA), and polyethylene naphthalate (PEN), but is not limited thereto. The rigid substrate is selected from at least one of polyetheretherketone (PEEK), polyphenylene sulfide (PPS), polysulfone (PSF), liquid crystal polymer (LCP), glass, silicon wafer, and ceramic, but is not limited thereto. A temperature of heating and drying is 50-80° C., and a duration is 2-12 h.

The laser in step (4) is a continuous green light with a wavelength of 532 nm. The laser direct writing-induced passivation/photothermal reduction sintering is performed with a power of 100-400 mW, a speed of 20-200 mm/s, and a scanning period of 20-40 μm.

A surface of the high-temperature resistant nano-copper exhibits excellent oxidation resistance and thermal stability after laser direct writing-induced passivation of $HCOO^-$, while also maintaining superior conductivity.

The present disclosure also provides an integrated sensor system based on all-laser in-situ direct writing, which includes a special engineering plastic substrate, a high-temperature resistant nano-copper circuit, a laser-induced graphene temperature sensor, a voltage divider, an analog-to-digital converter (ADC), a microcontroller unit (MCU) and a low dropout linear regulator (LDO). The remaining components are connected through the high-temperature resistant nano-copper circuit to achieve the integrated sensor functionality. The high-temperature resistant nano-copper circuit and the laser-induced graphene temperature sensor are formed in-situ on the special engineering plastic substrate using all-laser direct writing technology (laser direct writing-induced passivation/photothermal reduction sintering and laser induced carbonization). The high-temperature resistant nano-copper is prepared using any of the above-mentioned preparation methods for high-temperature resistant nano-copper. The special engineering plastic substrate is usually one or more of PI, PEEK, PPS, PSF, and LCP, with PEEK and PPS being particularly preferred due to the suitability thereof for applications in aerospace, automobile, electronics and other fields.

Laser direct writing-induced passivation based on laser processing refers to inducing a passivation reaction of $HCOO^-$ on the surface of nano-copper through high-energy laser irradiation. The copper ions on the surface of nano-copper form a copper formate dimer complex with HCOO—, creating a stable and effective oxidation-resistant coordination passivation layer. This improves the surface properties of nano-copper, greatly improving its oxidation resistance and thermal stability, resulting in high-temperature resistant nano-copper. In the present disclosure, the laser direct writing-induced passivation offers the following advantages.

(1) Efficient processing: the laser direct writing-induced passivation process is extremely rapid, focusing high-intensity energy and forming a reaction temperature field in a short time to complete formate passivation on the surface of nano-copper. Compared with traditional chemical passivation or physical coating methods, this method significantly shortens the production cycle and improves processing efficiency.

(2) Patterning control: the laser direct writing-induced passivation allows precise control over the treated area. Its typical patterning capability enables localized passivation of the nano-copper surface, thereby achieving targeted improvement in high-temperature oxidation resistance for specific areas of nano-copper.

(3) Without additional treatment: the laser direct writing-induced passivation does not depend on pre-treatment, post-treatment or additional chemical reagents, and can be carried out directly in an atmospheric environment without harsh reaction conditions such as vacuum or inert atmosphere. The treatment process is simple, greatly reducing the manufacturing costs, and is an environmentally friendly oxidation-resistant surface treatment method.

(4) Multi-performance integration: the laser direct writing-induced passivation improves the oxidation resistance of nano-copper, enhances its thermal stability at high temperatures, and provides excellent conductivity, all while sintering nano-copper oxide into nano-copper in a one-step direct writing process.

(5) Strong compatibility: the laser direct writing-induced passivation is not limited by the shape and complexity of nano-copper materials, and is suitable for nano-copper with multiple sizes.

DETAILED DESCRIPTION

Figure 1:
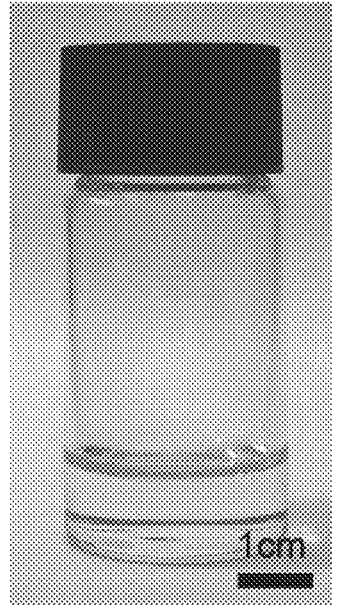
FIG. 1 shows an optical photograph of a prepared precursor solution.

The present disclosure will be described in detail below by examples with reference to the accompanying drawings. The following examples are intended solely to clearly illustrate the technical solutions of the present disclosure and are serve as examples only, and cannot be used to limit the scope of protection of the present disclosure.

A first aspect of the present disclosure provides a preparation method for a high-temperature resistant nano-copper produced by laser direct writing, which mainly includes the following steps:

In (1), an alcohol solvent, an organic dispersant, an organic auxiliary agent and an appropriate amount of formate are heated and stirred uniformly to obtain a precursor solution.

In (2), an appropriate amount of nano-copper oxide is added into the precursor solution and thoroughly dispersed via ultrasonication to obtain a nano-copper oxide ink.

In (3), the nano-copper oxide ink is coated onto a pretreated substrate, heated and dried to obtain a nano-copper oxide film.

In (4), the nano-copper oxide film is subjected to laser direct writing-induced passivation/photothermal reduction sintering to obtain a high-temperature resistant nano-copper.

Example 1

In S1, 0.5 g of polyvinylpyrrolidone and 0.15 g of sodium formate were weighed and mixed in 3.0 mL of ethylene glycol. The mixture was heated and stirred uniformly at 60° C. at 1200 rpm for 6 h to obtain a precursor solution.

In S2, 1.5 g of copper oxide nanowires (40 nm) were weighed and added to the precursor solution for sufficient ultrasonic dispersion. The ultrasonic real-time temperature was 55° C., the ultrasonic pulse width was 0.1 s, and the ultrasonic duration was 2 min to obtain a nano-copper oxide solution 1.

In S3, 1.5 g of copper oxide nanowires (40 nm) were weighed and added to the nano-copper oxide solution 1 for sufficient ultrasonic dispersion. The ultrasonic real-time temperature was 55° C., the ultrasonic pulse width was 0.1 s, and the ultrasonic duration was 2 min to obtain a nano-copper oxide solution 2.

In S4, 2.0 g of copper oxide nanowires (40 nm) were weighed and added to the nano-copper oxide solution 2 for sufficient ultrasonic dispersion. The ultrasonic real-time temperature was 55° C., the ultrasonic pulse width was 0.1 s, and the ultrasonic duration was 3 min to obtain a nano-copper oxide ink.

In S5, the nano-copper oxide ink was mechanically shaken uniformly for 1 min and left to stood for later use.

In S6, a piece of polyphenylene sulfide special engineering plastic substrate with a thickness of 2 mm and a size of 20×50 mm was taken, and surface impurities were removed by ultrasonic cleaning with isopropyl alcohol for 5 min and dried for later use.

In S7, the polyphenylene sulfide special engineering plastic substrate was subjected to oxygen plasma surface treatment for 120 s.

In S8, the polyphenylene sulfide special engineering plastic substrate was vacuum-adsorbed onto the spin coating chuck of a spin coater. Then, 1.5 mL of nano-copper oxide ink was dropped onto the center of the substrate and spin-coated at 1000 rpm for 20 s and 500 rpm for 10 S.

In S9, the polyphenylene sulfide special engineering plastic substrate coated with the nano-copper oxide ink was placed in a constant temperature blast drying oven or a vacuum drying oven for heating and drying at 60° C. for 2 h to obtain a nano-copper oxide film.

In S10, the polyphenylene sulfide special engineering plastic substrate coated with the nano-copper oxide film was placed on a laser processing platform with a continuous green light wavelength of 532 nm, and the height of the processing platform was adjusted for laser focusing.

In S11, a serpentine electrode pattern with a size of 18.0×15.3 mm was drawn. Patterned direct writing (laser direct writing-induced passivation/photothermal reduction sintering) was performed along the filling path of the serpentine electrode pattern with a power of 250 mW, a speed of 40 mm/s and a line scanning period of 30 μm. The black nano-copper oxide at the scanning path was converted into red nano-copper, resulting in a high-temperature resistant nano-copper electrode.

FIG. 1 shows an optical photograph of the prepared precursor solution.

Figure 2:
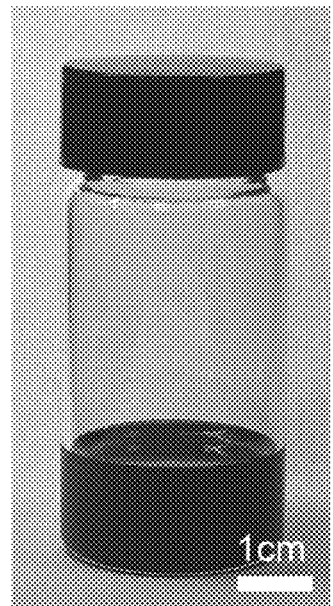
FIG. 2 shows an optical photograph of prepared nano-copper oxide ink.

FIG. 2 shows an optical photograph of the prepared nano-copper oxide ink.

Figure 3:
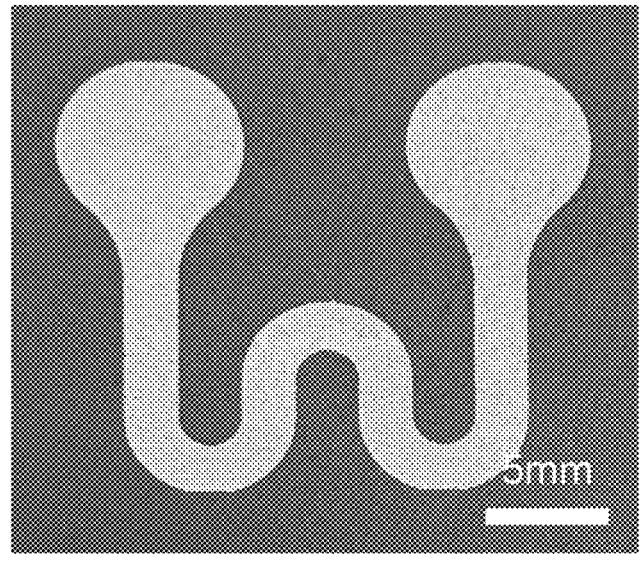
FIG. 3 shows an optical photograph of a prepared high-temperature resistant nano-copper electrode with a serpentine pattern.

FIG. 3 shows an optical photograph of the prepared high-temperature resistant nano-copper electrode with a serpentine pattern.

Example 2

In S1, 0.5 g of polyvinylpyrrolidone and 0.05 g/0.10 g/0.15 g/0.20 g/0.25 g of sodium formate were weighed and mixed in a 3.0 mL of ethylene glycol and 1.0 mL of N,N-dimethylformamide solution. The mixture was heated and stirred uniformly at 60° C. at 1200 rpm for 12 h to obtain five precursor solutions with different sodium formate concentrations.

In S2, 2.0 g of copper oxide nanowires (40 nm) were weighed and added to the five precursor solutions for sufficient ultrasonic dispersion. The ultrasonic real-time temperature was 55° C., the ultrasonic pulse width was 0.1 s, and the ultrasonic duration was 3 min to obtain five nano-copper oxide solutions 1.

In S3, 2.0 g of copper oxide nanowires (40 nm) were weighed and added to the five nano-copper oxide solutions 1 for sufficient ultrasonic dispersion. The ultrasonic real-time temperature was 55° C., the ultrasonic pulse width was 0.1 s, and the ultrasonic duration was 3 min to obtain five nano-copper oxide solutions 2.

In S4, 1.0 g of copper oxide nanowires (40 nm) were weighed and added to the five nano-copper oxide solutions 2 for sufficient ultrasonic dispersion. The ultrasonic real-time temperature was 55° C., the ultrasonic pulse width was 0.1 s, and the ultrasonic duration was 2 min to obtain five nano-copper oxide inks.

In S5, the nano-copper oxide inks were mechanically shaken uniformly for 2 min and left to stood for later use.

In S6, five pieces of polyphenylene sulfide special engineering plastic substrates with a thickness of 2 mm and a size of 20×50 mm were taken, and surface impurities were removed by ultrasonic cleaning with isopropyl alcohol for 5 min and dried for later use.

In S7, the polyphenylene sulfide special engineering plastic substrates were subjected to oxygen plasma surface treatment for 120 s.

In S8, the polyphenylene sulfide special engineering plastic substrates were vacuum-adsorbed onto the spin coating chuck of the spin coater. Then, 1.5 mL of nano-copper oxide inks with different sodium formate concentrations were dropped onto the centers of the substrates and spin-coated at 1000 rpm for 20 s and 500 rpm for 10 s.

In S9, the polyphenylene sulfide special engineering plastic substrates coated with the nano-copper oxide inks were placed in the constant temperature blast drying oven or the vacuum drying oven for heating and drying at 60° C. for 5 h to obtain nano-copper oxide films.

In S10, the polyphenylene sulfide special engineering plastic substrates coated with nano-copper oxide films were placed on the laser processing platform with a continuous green light wavelength of 532 nm, and the height of the processing platform was adjusted for laser focusing.

In S11, the rectangular electrode patterns with a size of 36×6 mm were drawn. Patterned direct writing (laser direct writing-induced passivation/photothermal reduction sintering) was performed along the filling paths of the rectangular electrode patterns in sequence with a power of 250 mW, a speed of 40 mm/s and a line scanning period of 35 μm. The black nano-copper oxide at the scanning paths was converted into red nano-copper, resulting in nano-copper electrodes.

In S12, the thin silver paste extraction electrodes were manually coated at both ends of each nano-copper electrode and placed in the vacuum drying oven for heating and drying at 60° C. for 4 h.

In S13, the voltage dividing circuit boards were designed according to the resistance of the nano-copper electrodes. Each nano-copper electrode was connected in sequence through crocodile clip wires, and a data acquisition instrument was connected through a DuPont wire.

In S14, the nano-copper electrodes were placed in the constant temperature blast drying oven at 170° C., and the partial pressure changes were recorded in real time by the data acquisition instrument.

In S15, the data results were converted into relative resistance changes of the nano-copper electrodes by partial voltage formula.

Figure 4:
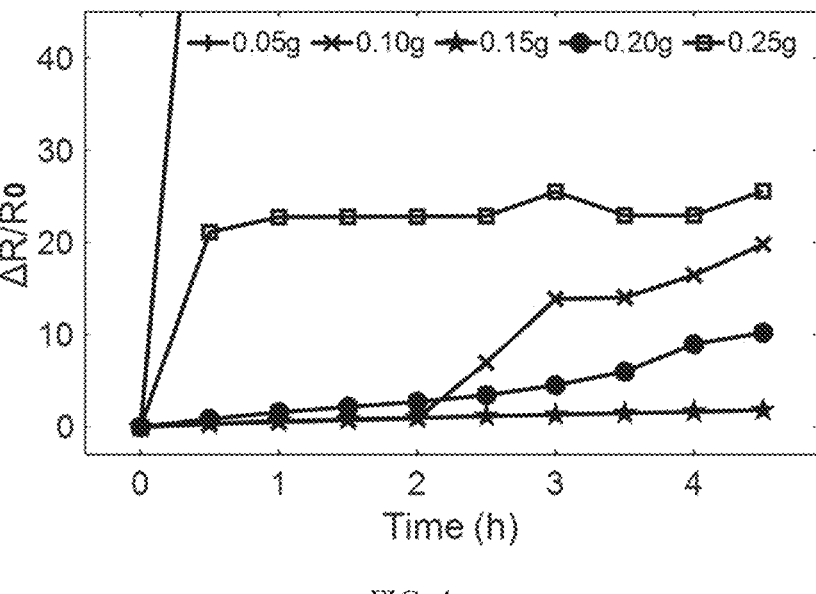
FIG. 4 shows relative resistance changes of the nano-copper at different sodium formate concentrations heated at 170° C. for different durations in a dry air atmosphere.

FIG. 4 shows relative resistance changes of the nano-copper with different sodium formate concentrations at 170° C. over time. It can be seen that when the content of sodium formate is 0.15 g, the high-temperature resistance of the nano-copper after laser direct writing-induced passivation is the best. When the content of sodium formate is reduced, the complex formed by the sodium formate coordination with the nano-copper surface is insufficient to resist oxygen invasion, resulting in poor high-temperature oxidation resistance. When the content of sodium formate increases, additional reactions between nano-copper interfaces will be triggered, affecting the passivation effect and surface properties and leading to the failure of high-temperature oxidation resistance of the nano-copper over time.

Example 3

In S1, 0.5 g of polyvinylpyrrolidone and 0.15 g of sodium formate were weighed and mixed in 3.0 mL of ethylene glycol and 3.0 mL of isopropanol. The mixture was heated and stirred uniformly at 60° C. at 1200 rpm for 6 h to obtain a precursor solution.

In S2, 2.0 g/3.0 g/4.0 g/5.0 g/6.0 g/7.0 g of copper oxide nanowires (40 nm) were weighted in sequence, and added in small amounts to the precursor solution for sufficient ultrasonic dispersion. The ultrasonic real-time temperature was 55° C., the ultrasonic pulse width was 0.1 s, and the single ultrasonic duration was 2 min to obtain nano-copper oxide inks with different concentrations of copper oxide nanowires.

In S3, the nano-copper oxide inks were mechanically shaken uniformly for 1-3 min and left to stood for later use.

In S4, six pieces of polyphenylene sulfide special engineering plastic substrates with a thickness of 2 mm and a size of 20×50 mm were taken, and surface impurities were removed by ultrasonic cleaning with isopropyl alcohol for 5 min and dried for later use.

S5 was the same as S7 in Example 2.

In S6, the polyphenylene sulfide special engineering plastic substrates were vacuum-adsorbed onto the spin coating chuck of the spin coater in sequence. Then, 1.5 mL of nano-copper oxide inks with different concentrations of copper oxide nanowires were dropped onto the centers of the substrates and spin-coated at 1000 rpm for 20 s and 500 rpm for 10 s.

In S7, the polyphenylene sulfide special engineering plastic substrates coated with the nano-copper oxide inks were placed in the constant temperature blast drying oven or the vacuum drying oven for heating and drying at 60° C. for 6 h to obtain the nano-copper oxide films.

S8-S9 were the same as S10-S11 in Example 2.

In S10, the thin silver paste extraction electrodes were manually coated at both ends of each nano-copper electrode and placed in the vacuum drying oven for heating and drying at 60° C. for 4.5 h.

In S11, the resistance of the nano-copper samples after laser surface treatment with different concentrations of copper oxide nanowires were measured by a benchtop multimeter.

Figure 5:
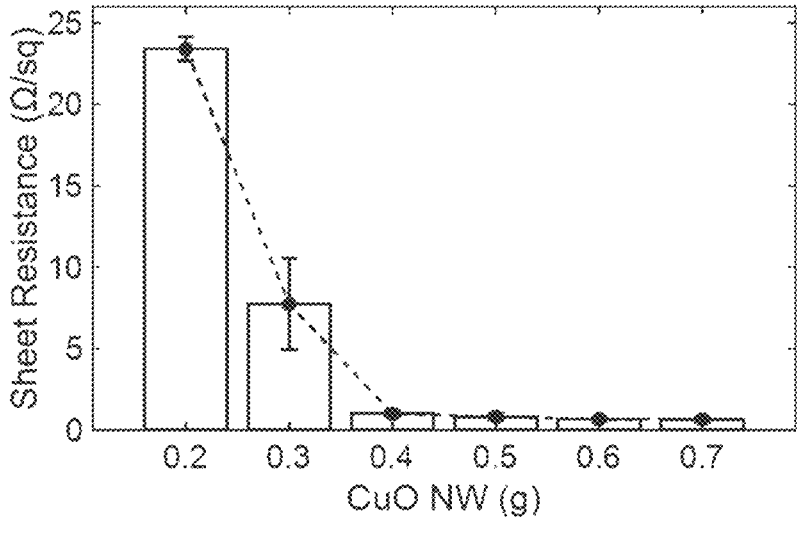
FIG. 5 shows resistance changes of the nano-copper after laser surface treatment at different concentrations of copper oxide nanowires.

FIG. 5 shows the resistance changes of the nano-copper after laser surface treatment with different concentrations of copper oxide nanowires. It can be seen that with the content of copper oxide nanowires gradually increases, the content of nano-copper after laser photothermal reduction sintering also increases, the resistance decreases, and the conductivity tends to saturate (with a minimum of 0.66 Ω/sq).

Example 4

In S1, 0.5 g of polyvinylpyrrolidone and 0.15 g of sodium formate were weighed and mixed in a 3.0 mL of ethylene glycol and 1.0 mL of N, N-dimethylformamide solution. The mixture was heated and stirred uniformly at 60° C. at 1200 rpm for 12 h to obtain the precursor solution.

S2-S5 were the same as in Example 2.

In S6, seven pieces of polyphenylene sulfide special engineering plastic substrates with a thickness of 2 mm and a size of 20×50 mm were taken, and surface impurities were removed by ultrasonic cleaning with isopropyl alcohol for 5 min and dried for later use.

S7-S8 were the same as in Example 1.

S9 was the same as S7 in Example 3.

S10 was the same as in Example 1.

In S11, the rectangular electrode patterns with a size of 36×6 mm were drawn. Patterned direct writing (laser direct writing-induced passivation/photothermal reduction sintering) was performed along the filling paths of the rectangular electrode patterns in sequence with powers of 100 mW/150 mW/200 mW/250 mW/300 mW/350 mW/400 mW, a speed of 40 mm/s and a line scanning period of 35 μm. The black nano-copper oxide at the scanning paths was converted into red nano-copper, resulting in nano-copper electrodes.

In S12, the thin silver paste extraction electrodes were manually coated at both ends of each nano-copper electrode and placed in the vacuum drying oven for heating and drying at 60° C. for 6 h.

In S13, the resistance of the nano-copper electrodes after surface treatment with different laser powers were measured by the desktop multimeter.

S14 was the same as S13 in Example 2.

In S15, the nano-copper electrodes were placed in the constant temperature blast drying oven at 80° C., and the partial pressure changes were recorded in real time by the data acquisition instrument.

S16 was the same as S15 in Example 2.

Figure 6:
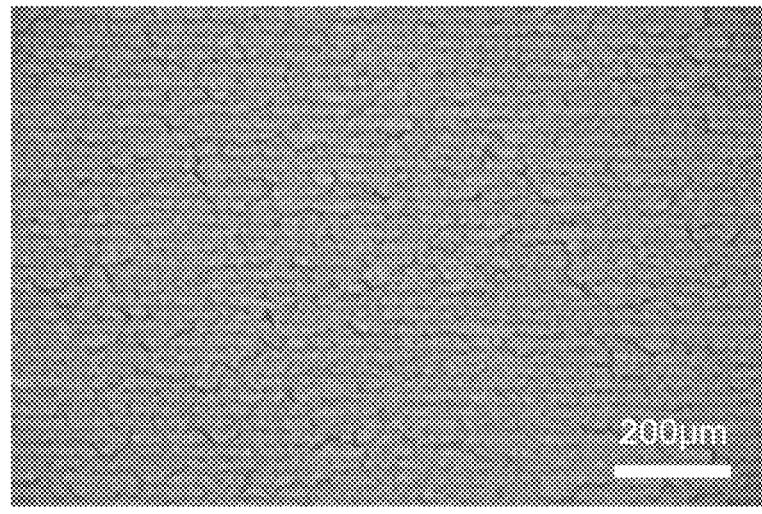
FIG. 6 shows an optical image of the nano-copper under a laser power of 250 mW.
Figure 7:
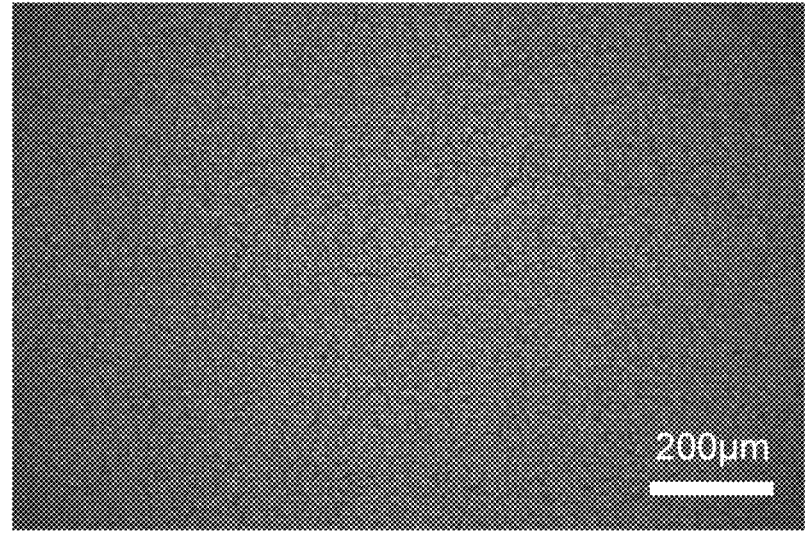
FIG. 7 shows an optical image of the nano-copper under a laser power of 100 mW.
Figure 8:
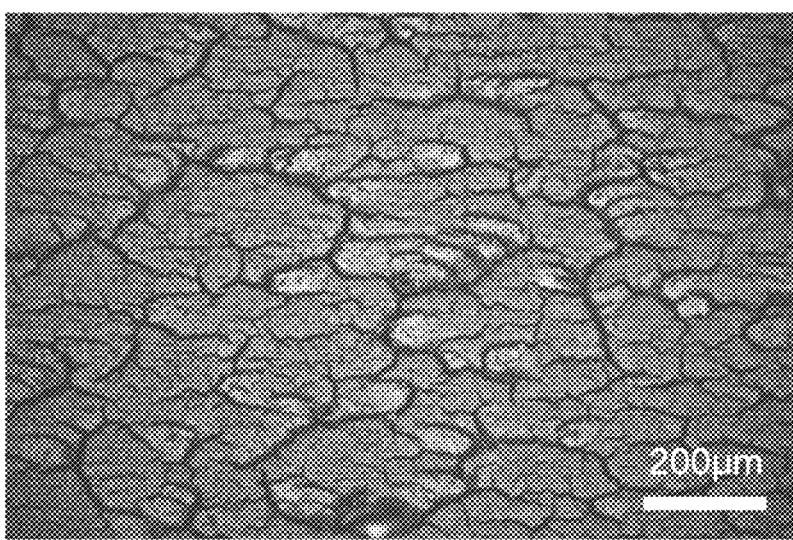
FIG. 8 shows an optical image of the nano-copper under a laser power of 400 mW.

FIG. 6 shows an optical image of the nano-copper under a laser power of 250 mW. FIG. 7 shows an optical image of the nano-copper under a laser power of 100 mW. FIG. 8 shows an optical image of the nano-copper under a laser power of 400 mW. It can be seen that when the laser power is 250 mW, the surface of the reduced and sintered nano-copper is dense, flat, and bright in color. When the laser power is low (100 mW), the reduction threshold of the nano-copper is not reached, and the surface appears dark red with remained copper oxides. However, when the laser power is high (400 mW), excessive energy input leads to stress concentration in the surface area of the nano-copper and causes cracks.

Figure 9:
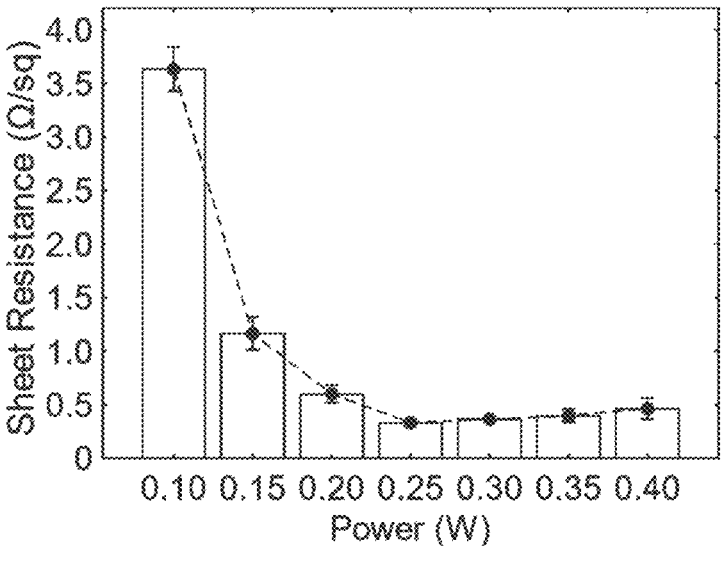
FIG. 9 shows resistance changes of the nano-copper after surface treatment under different laser powers.

FIG. 9 shows resistance changes of the nano-copper after surface treatment under different laser powers. It can be seen that with the laser power gradually increases, the energy per unit area of the focused spot increases, resulting in a more significant photothermal effect and a more sufficient reduction sintering reaction. When the laser power is between 250-400 mW, the conductivity of the nano-copper electrode after surface treatment tends to saturate (with a minimum of 0.36 Ω/sq).

Figure 10:
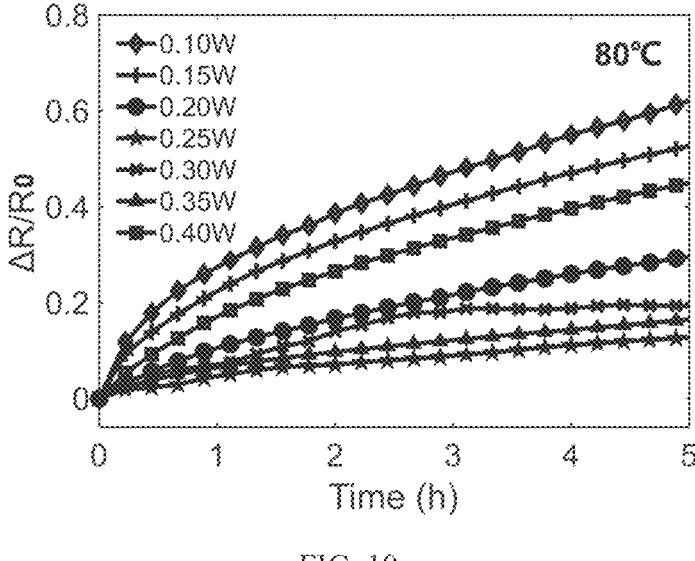
FIG. 10 shows relative resistance changes of the nano-copper after the surface treatment under different laser powers at 80° C. over time.

FIG. 10 shows relative resistance changes of the nano-copper after the surface treatment under different laser powers at 80° C. over time. It can be seen that when the laser power is 250 mW, the reaction temperature field and conditions of coordination passivation of HCOO-induced by laser direct writing are the most reasonable. When the laser power increases or decreases, the high-temperature resistance and oxidation resistance of the nano-copper are reduced due to over-sintering (re-oxidation of nano-copper) or insufficient reduction sintering (the surface of the nano-copper contains more copper oxides), leading to greater relative resistance changes over the same period.

Example 5

S1-S10 were the same as in Example 4.

In S11, the rectangular electrode patterns with a size of 36×6 mm were drawn. Patterned direct writing (laser direct writing-induced passivation/photothermal reduction sintering) was performed along the filling paths of the rectangular electrode patterns in sequence with a power of 250 mW, a speed of 40 mm/s and line scanning periods of 15 μm/20 μm/25 μm/30 μm/35 μm/40 μm/45 μm. The black nano-copper oxide at the scanning paths was converted into red nano-copper, resulting in nano-copper electrodes.

S12 was the same as Example 4.

In S13, the resistance of the nano-copper electrodes after surface treatment with different laser line scanning periods were measured by the desktop multimeter.

S14 was the same as Example 4.

In S15, the nano-copper electrodes were placed in the constant temperature blast drying oven at 170° C., and the partial pressure changes were recorded in real time by the data acquisition instrument.

S16 was the same as in Example 4.

Figure 11:
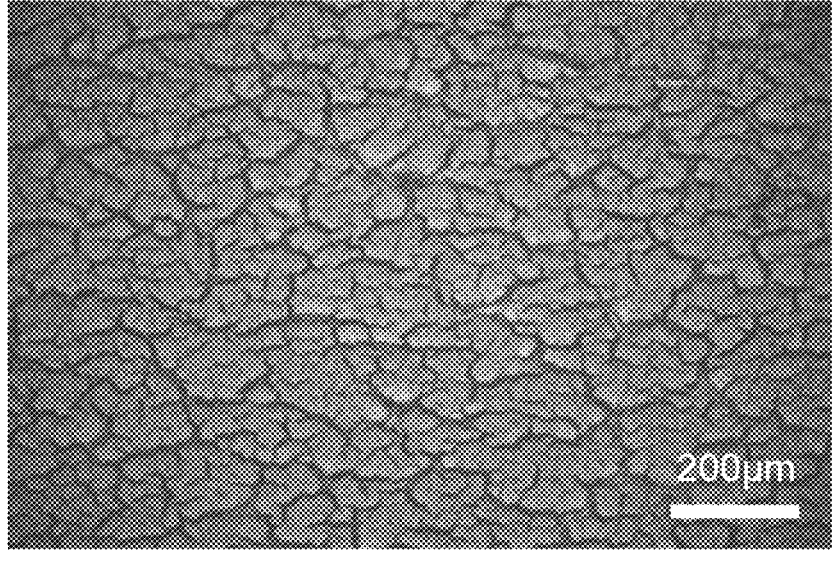
FIG. 11 shows an optical image of the nano-copper with a laser line scanning period of 15 μm.
Figure 12:
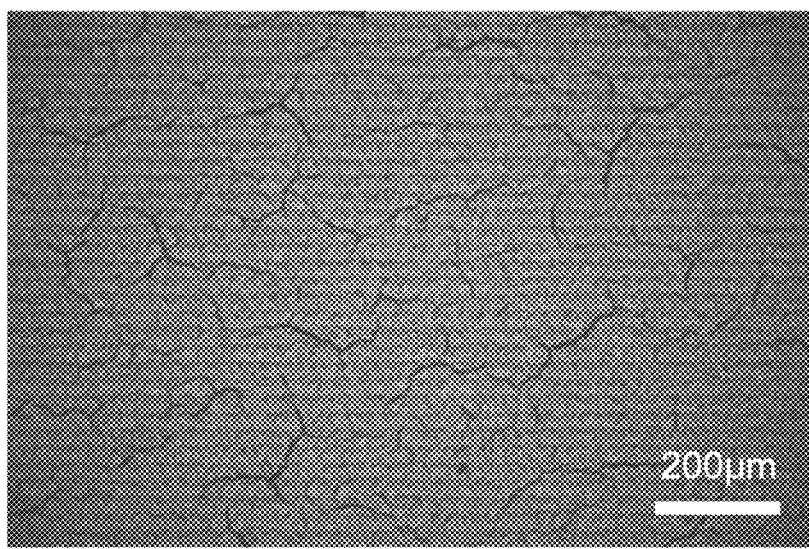
FIG. 12 shows an optical image of the nano-copper with a laser line scanning period of 45 μm.

FIG. 6 shows an optical image of the nano-copper under a laser line scanning period of 35 μm. FIG. 11 shows an optical image of the nano-copper with a laser line scanning period of 15 μm. FIG. 12 shows an optical image of the nano-copper with a laser line scanning period of 45 μm. It can be seen that when the laser line scanning period is 35 μm, the period is close to the laser spot size, and the surface of the reduced and sintered nano-copper is dense and flat. When the scanning period of laser line is small (15 μm), the overlapping area of the scanning paths increases, leading to the increase of heat accumulation and thermal stress in the repeated scanning area, which causes cracks on the surface of the nano-copper. When the laser line scanning period is large (45 μm), thermal barriers appear between the scanning paths, which also causes fine cracks.

Figure 13:
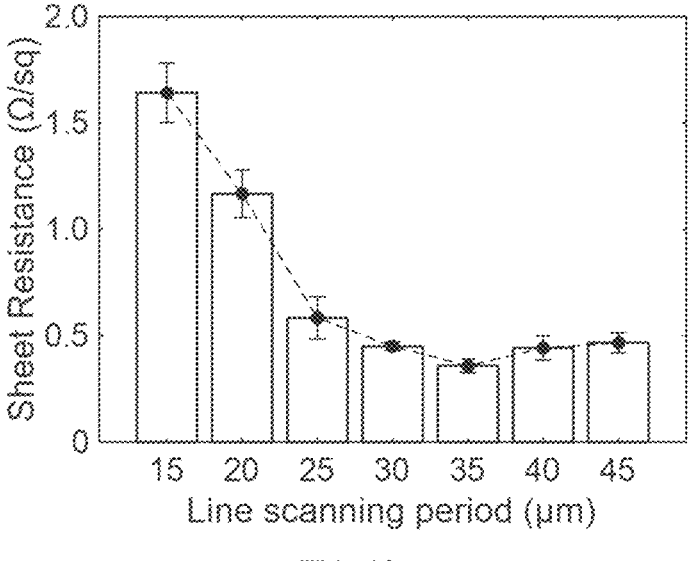
FIG. 13 shows resistance changes of the nano-copper after surface treatment with different laser line scanning periods.

FIG. 13 shows resistance changes of the nano-copper after surface treatment with different laser line scanning periods. It can be seen that when the laser line scanning period is 35 μm, the resistance of the reduced and sintered nano-copper is the lowest (0.36 Ω/sq). As the laser line scanning period gradually decreases, the excessive sintering caused by repeated heat accumulation degrades the conductivity of the nano-copper. Conversely, as the laser line scanning period gradually increases, the surface defects caused by the difference of photothermal reduction sintering energy during the cycle also affect the conductivity of the nano-copper.

Figure 14:
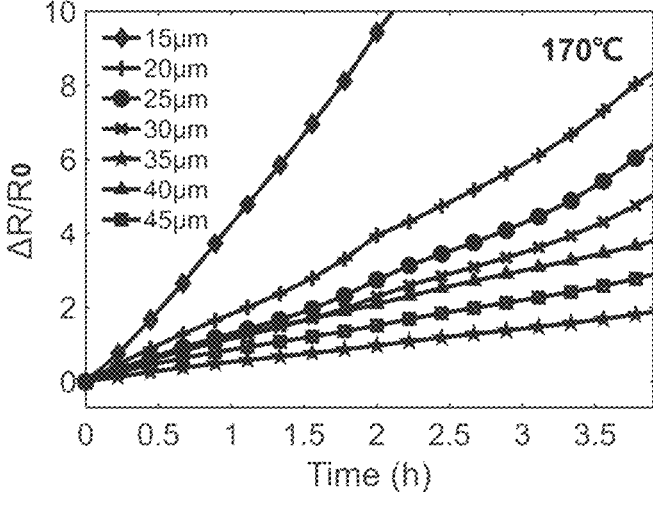
FIG. 14 shows relative resistance changes of the nano-copper after treatment with different laser line scanning periods at 170° C. over time.

FIG. 14 shows relative resistance changes of the nano-copper after treatment with different laser line scanning periods at 170° C. over time. It can be seen that when the laser line scanning period is 35 μm, the nano-copper after laser direct writing-induced passivation exhibits good thermal stability at high temperature. When the laser line scanning period is reduced, the cracks caused by thermal stress accelerate the infiltration of oxygen at high temperature, resulting in the decrease of oxidation resistance of the nano-copper. When the laser line scanning period increases, the barriers caused by the heat difference lead to surface defects in the nano-copper. Similarly, the high-temperature oxidation resistance is poor, and the relative resistance changes are more significant over the same period.

Example 6

S1-S5 were the same as in Example 4.

S6-S10 were the same as in Example 1.

In S11, the rectangular electrode pattern with a size of 36×6 mm was drawn. Patterned direct writing (laser direct writing-induced passivation/photothermal reduction sintering) was performed along the filling path of the rectangular electrode pattern with a power of 250 mW, a speed of 40 mm/s and a line scanning period of 35 μm. The black nano-copper oxide at the scanning path was converted into red nano-copper, resulting in a nano-copper electrode.

In S12, the thin silver paste extraction electrodes were manually coated at both ends of the nano-copper electrode and placed in the vacuum drying oven for heating and drying at 60° C. for 2 h.

In S13, the voltage dividing circuit board was designed according to the resistance of the nano-copper electrode. The nano-copper electrode was connected through the crocodile clip wire, and the data acquisition instrument was connected through the DuPont wire.

In S14, 0.5 g of polyvinylpyrrolidone was weighed and mixed in a 3.0 mL of ethylene glycol and 1.0 mL of N,N-dimethylformamide solution. The mixture was heated and stirred uniformly at 60° C. at 1200 rpm for 12 h to obtain a sodium formate-free precursor solution.

In S15, 2.0 g of copper oxide nanowires (40 nm) was weighed and added to the sodium formate-free precursor solution for sufficient ultrasonic dispersion. The ultrasonic real-time temperature was 55° C., the ultrasonic pulse width was 0.1 s, and the ultrasonic duration was 3 min to obtain a sodium formate-free nano-copper oxide solution 1.

In S16, 2.0 g of copper oxide nanowires (40 nm) was weighed and added to the sodium formate-free nano-copper oxide solution 1 for sufficient ultrasonic dispersion. The ultrasonic real-time temperature was 55° C., the ultrasonic pulse width was 0.1 s, and the ultrasonic duration was 3 min to obtain a sodium formate-free nano-copper oxide solution 2.

In S17, 1.0 g of copper oxide nanowires (40 nm) was weighed and added to the sodium formate-free nano-copper oxide solution 2 for sufficient ultrasonic dispersion. The ultrasonic real-time temperature was 55° C., the ultrasonic pulse width was 0.1 s, and the ultrasonic duration was 2 min to obtain a sodium formate-free nano-copper oxide ink.

In S18, the sodium formate-free nano-copper oxide ink was mechanically shaken uniformly for 2 min and left to stood for later use.

S19-S20 were the same as S6-S7 in Example 1.

In S21, the polyphenylene sulfide special engineering plastic substrate was vacuum-adsorbed on the spin coating chuck of the spin coater. Then, 1.5 mL of sodium formate-free nano-copper oxide ink was dropped onto the center of the substrate and spin-coated at 1000 rpm for 20 s and 500 rpm for 10 s.

In S22, the polyphenylene sulfide special engineering plastic substrate coated with the sodium formate-free nano-copper oxide ink was placed in the constant temperature blast drying oven or the vacuum drying oven for heating and drying at 60° C. for 2 h to obtain a sodium formate-free nano-copper oxide film.

In S23, the polyphenylene sulfide special engineering plastic coated with the sodium formate-free nano-copper oxide film was placed on the laser processing platform with a continuous green light wavelength of 532 nm, and the height of the processing platform was adjusted for laser focusing.

In S24, the rectangular electrode pattern with a size of 36×6 mm was drawn. Patterned direct writing (laser direct writing-induced passivation/photothermal reduction sintering) was performed along the filling path of the rectangular electrode pattern with a power of 250 mW, a speed of 40 mm/s and a line scanning period of 35 μm. The black nano-copper oxide at the scanning path was converted into red nano-copper, resulting in a sodium formate-free nano-copper electrode.

In S25, the thin silver paste extraction electrodes were manually coated at both ends of the sodium formate-free nano-copper electrode and placed in the vacuum drying oven for heating and drying at 60° C. for 2 h.

In S26, the voltage dividing circuit board was designed according to the resistance of the sodium formate-free nano-copper electrode The sodium formate-free nano-copper electrode was connected through the crocodile clip wire, and the data acquisition instrument was connected through the DuPont wire.

In S27, the nano-copper electrode and the sodium formate-free nano-copper electrode were placed in the constant temperature blast drying oven at 170° C., and the partial pressure changes were recorded in real time by the data acquisition instrument.

In S28, the data results were converted into relative resistance changes of the nano-copper electrode and the sodium formate-free nano-copper electrode by partial pressure formula.

Figure 15:
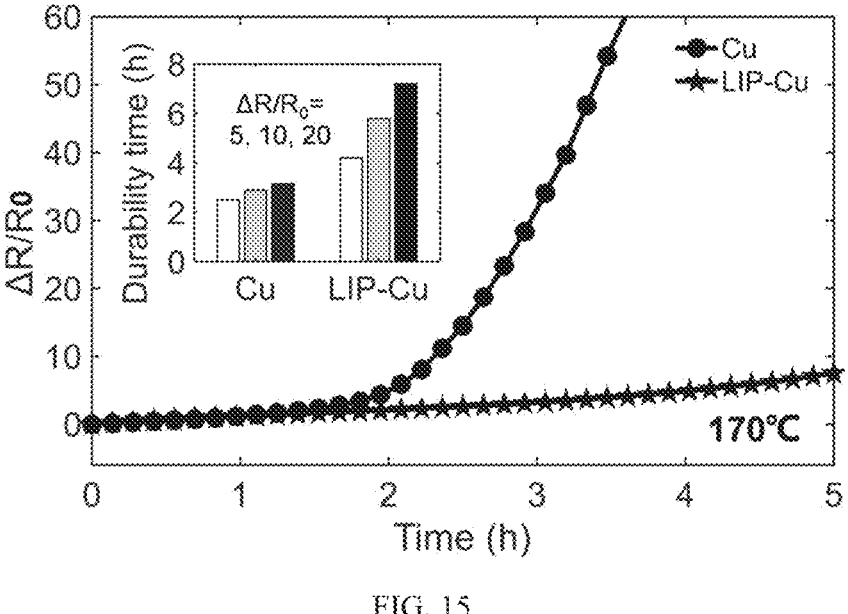
FIG. 15 shows relative resistance changes of the nano-copper (LIP-Cu) and the sodium formate-free nano-copper (Cu) at 170° C. over time.

FIG. 15 shows relative resistance changes of the nano-copper (LIP-Cu) and the sodium formate-free nano-copper (Cu) at 170° C. over time. It can be seen that the high-temperature oxidation resistance of the sodium formate-free nano-copper is significantly inferior to that of the nano-copper. The nano-copper is protected by laser-induced coordination passivation of $HCOO^-$, which offers superior thermal stability at the high temperature of 170° C.

Example 7

S1-S26 were the same as in Example 6.

In S27: the nano-copper electrode and the sodium formate-free nano-copper electrode were placed in the constant temperature blast drying oven at 120° C., and the partial pressure changes were recorded in real time by the data acquisition instrument.

S28 was the same as in Example 6.

Figure 16:
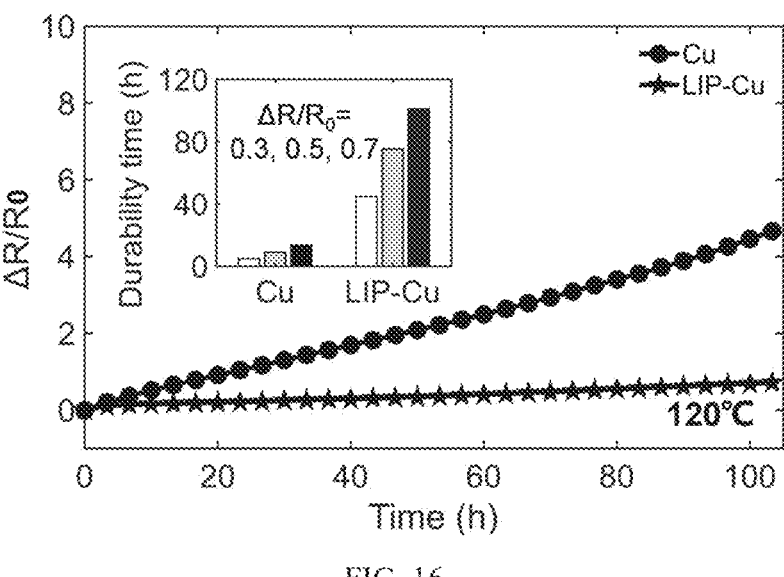
FIG. 16 shows relative resistance changes of the nano-copper (LIP-Cu) and the sodium formate-free nano-copper (Cu) at 120° C. over time.

FIG. 16 shows relative resistance changes of the nano-copper (LIP-Cu) and the sodium formate-free nano-copper (Cu) at 120° C. over time. It can be seen that the conductivity of the sodium formate-free nano-copper continues to degrade at 120° C., while the conductivity of the nano-copper remains stable within 105 h without obvious degradation.

Example 8

S1-S26 were the same as in Example 6.

In S27: the nano-copper electrode and the sodium formate-free nano-copper electrode were placed in the constant temperature blast drying oven. The temperature was gradually increased from 30° C. to 190° C. with an increment of 20° C. Each temperature point lasted for 10 min, and the partial pressure change was recorded in real time by the data acquisition instrument.

S28 was the same as in Example 6.

Figure 17:
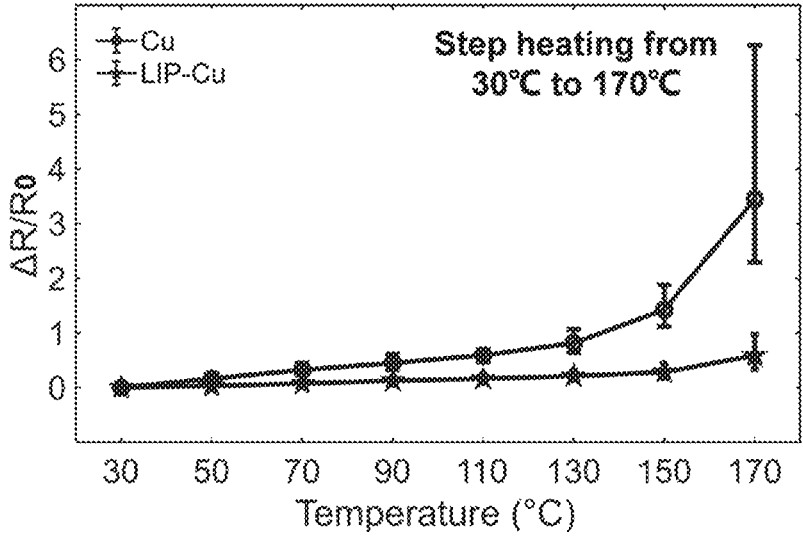
FIG. 17 shows relative resistance changes of the nano-copper (LIP-Cu) and the sodium formate-free nano-copper (Cu) as the temperature gradually increasing from 30° C. to 170° C.

FIG. 17 shows relative resistance changes of the nano-copper (LIP-Cu) and the sodium formate-free nano-copper (Cu) as the temperature gradually increasing from 30° C. to 170° C. It can be seen that the degradation of the electrical properties of the sodium formate-free nano-copper gradually accelerates during the stepwise heating process, while the electrical properties of the nano-copper remain stable until the temperature reaches 150° C. and only slightly decrease when heated to 170° C.

The second aspect of the present disclosure provides an integrated sensor system based on all-laser in-situ direct writing, which includes a special engineering plastic rigid substrate, a high-temperature resistant nano-copper circuit, a laser-induced graphene temperature sensor, a voltage divider, an ADC, an MCU and an LDO.

Example 9

In S1, a PI tape with a width of 50 mm was adhered to the surface of a polyphenylene sulfide special engineering plastic substrate with a length of 60 mm, a width of 60 mm and a thickness of 4 mm.

In S2, a circuit with an outer contour size of 45×27 mm was designed, and a 355 nm wavelength ultraviolet nanosecond pulsed laser was used to cut along the circuit contour.

In S3, the PI tape within the cut profile was peeled off from the polyphenylene sulfide special engineering plastic substrate.

In S4, an appropriate amount of nano-copper oxide ink prepared in Example 1 was applied and coated onto the polyphenylene sulfide special engineering plastic substrate, and then heated and dried.

In S5, the remaining PI tape was peeled off from the polyphenylene sulfide special engineering plastic substrate to obtain a nano-copper oxide film in the shape of the circuit profile.

In S6, laser direct writing-induced passivation/photothermal reduction sintering was performed along the filling path of the circuit pattern using a 532 nm continuous wavelength laser to obtain a high-temperature resistant nano-copper circuit.

In S7, a temperature sensor with an appropriate size and shape was designed, and a laser-induced graphene temperature sensor was formed via in-situ carbonization at the corresponding position on the surface of the polyphenylene sulfide special engineering plastic substrate using a 10.6 µm wavelength $CO_2$ laser.

In S8, each component was connected to the high-temperature resistant nano-copper circuit through copper paste according to the circuit design, and the copper paste was heated and solidified.

In S9, the integrated temperature sensor system was placed within the upper and lower temperature limits of the chip's tolerance range for temperature sensing and measurement. The system was connected to a data visualization serial port via an external DuPont line.

Figure 18:
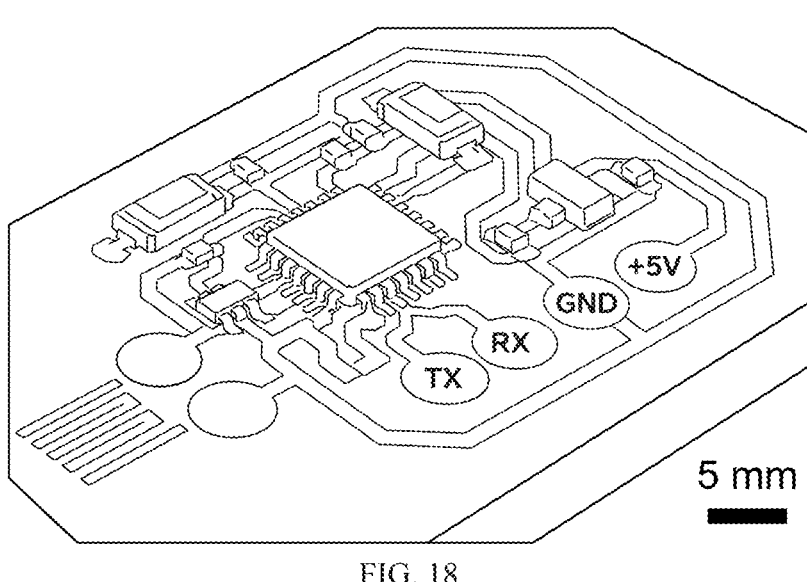
FIG. 18 is an optical photograph of an integrated sensor system based on all-laser in-situ direct writing.

FIG. 18 is an optical photograph of an integrated sensor system based on all-laser in-situ direct writing.

The invention claimed is:

1. A preparation method for a high-temperature resistant nano-copper produced by laser direct writing, comprising the following steps:
   (1) uniformly heating and stirring an alcohol solvent, an organic dispersant, an organic auxiliary agent and an appropriate amount of formate to obtain a precursor solution;
   (2) adding an appropriate amount of nano-copper oxide into the precursor solution and thoroughly dispersing the mixture via ultrasonication to obtain a nano-copper oxide ink, comprising 43.0-50.4 wt % of nano-copper oxide, 37.1-50.4 wt % of alcohol solvent, 3.4-5.3 wt % of organic dispersant, 0.0-9.5 wt % of organic auxiliary agent and 1.3-2.0 wt % of formate, and the nano-copper oxide being a copper oxide nanowire;
   (3) coating a pretreated substrate with the nano-copper oxide ink, followed by heating and drying to obtain a nano-copper oxide film;
   (4) applying one-step laser direct writing-induced passivation/photothermal reduction sintering to the nano-copper oxide film to obtain a high-temperature resistant nano-copper, wherein the laser is a continuous green light with a wavelength of 532 nm, a laser power is 100-400 mW, a laser speed is 20-200 mm/s and a laser scanning period is 20-40 µm; and the laser-induced passivation involves comprising a passivation reaction of $HCOO^-$ on a surface of the nano-copper, causing copper ions on the surface of the nano-copper to form a copper formate dimer complex with $HCOO^-$, forming an oxidation-resistant coordination passivation layer; wherein the high-temperature is 170° C., wherein a temperature of the heating and stirring in step (1) is 50-70° C., a rotation speed is 600-1500 rpm, and a duration is 2-20 h; a real-time temperature during the ultrasonic dispersion in step (2) is 50-60° C., an ultrasonic pulse width is 0.1 s, and an ultrasonic duration is 0.1-2 h; and a temperature of the heating and drying in step (3) is 50-80° C., and a duration is 2-12 h.

2. The preparation method for a high-temperature resistant nano-copper produced by laser direct writing according to claim 1, wherein the alcohol solvent in step (1) is selected from at least one of monohydric alcohols and polyhydric alcohols.

3. The preparation method for a high-temperature resistant nano-copper produced by laser direct writing according to claim 1, wherein the organic dispersant in step (1) is selected from at least one of polyacrylamide-based organic polymers, polyethylene oxide-based organic polymers, tannin, and lignin.

4. The preparation method for a high-temperature resistant nano-copper produced by laser direct writing according to claim 1, wherein the organic auxiliary agent in step (1), an organic amide, is selected from at least one of alkyl amides with a chemical formula conforming to $C_nH_{2n+1}NO$ (1≤n≤5).

5. The preparation method for a high-temperature resistant nano-copper produced by laser direct writing according to claim 1, wherein the formate in step (1) is selected from at least one of lithium formate, beryllium formate, sodium formate, magnesium formate, potassium formate, calcium formate, iron formate, manganese formate, cobalt formate, nickel formate, copper formate, zinc formate, barium formate, and ammonium formate.

6. The preparation method for a high-temperature resistant nano-copper produced by laser direct writing according to claim 1, wherein the pretreatment in step (3) is oxygen plasma surface treatment with a treatment duration of 60-150 s to form a pretreated substrate; subsequently coating the pretreated substrate with the nano-copper oxide ink.

* * * * *